(12) United States Patent
Beardmore et al.

(10) Patent No.: US 6,366,873 B1
(45) Date of Patent: Apr. 2, 2002

(54) DOPANT PROFILE MODELING BY RARE EVENT ENHANCED DOMAIN-FOLLOWING MOLECULAR DYNAMICS

(75) Inventors: Keith M. Beardmore, Santa Fe, NM (US); Niels G. Jensen, Davis, CA (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/429,266

(22) Filed: Oct. 29, 1999

Related U.S. Application Data

(60) Provisional application No. 60/116,525, filed on Jan. 20, 1999.

(51) Int. Cl.$^7$ ............................................. G06F 17/50
(52) U.S. Cl. ............................... 703/13; 703/2; 703/3; 703/12; 700/266; 700/121
(58) Field of Search ........................... 703/2, 3, 13, 12; 700/121, 266; 716/21

(56) References Cited

U.S. PATENT DOCUMENTS 5,206,506 A * 4/1993 Kirchner
6,212,487 B1 * 4/2001 Sakamoto

OTHER PUBLICATIONS

David Cai et al. "Simulation of Phosphorus Implantation into Silicon with a Single Parameter Electronic Stopping Power Model," International Journal of Modern Physics C, vol. 9, No. 3 (1998) 459–470.

Keith M. Beardmore et al. "An Efficient Molecular Dynamics Scheme for Predicting Dopant Implant Profiles in Semiconductors," Nuclear Instruments and Methods in Physics Research B 153 (1999) 391–397.

Keith M. Beardmore et al. "Efficient Molecular Dynamics Scheme for the Calculation of Dopant Profiles Due to Ion Implantation," Physical Review E, vol. 57, No. 6 (1998) 7278–7287.

* cited by examiner

Primary Examiner—Kevin J. Teska
Assistant Examiner—T. Phan
(74) Attorney, Agent, or Firm—Ray G. Wilson

(57) ABSTRACT

A computer-implemented molecular dynamics-based process simulates a distribution of ions implanted in a semiconductor substrate. The properties of the semiconductor substrate and ion dose to be simulated are first initialized, including an initial set of splitting depths that contain an equal number of virtual ions implanted in each substrate volume determined by the splitting depths. A first ion with selected velocity is input onto an impact position of the substrate that defines a first domain for the first ion during a first timestep, where the first domain includes only those atoms of the substrate that exert a force on the ion. A first position and velocity of the first ion is determined after the first timestep and a second domain of the first ion is formed at the first position. The first ion is split into first and second virtual ions if the first ion has passed through a splitting interval. The process then follows each virtual ion until all of the virtual ions have come to rest. A new ion is input to the surface and the process repeats until all of the ion dose has been input. The resulting ion rest positions form the simulated implant distribution.

8 Claims, 9 Drawing Sheets

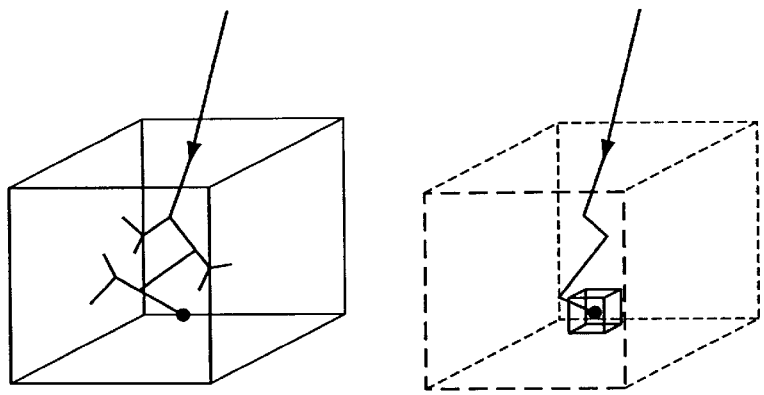
Fig. 1A  Fig. 1B
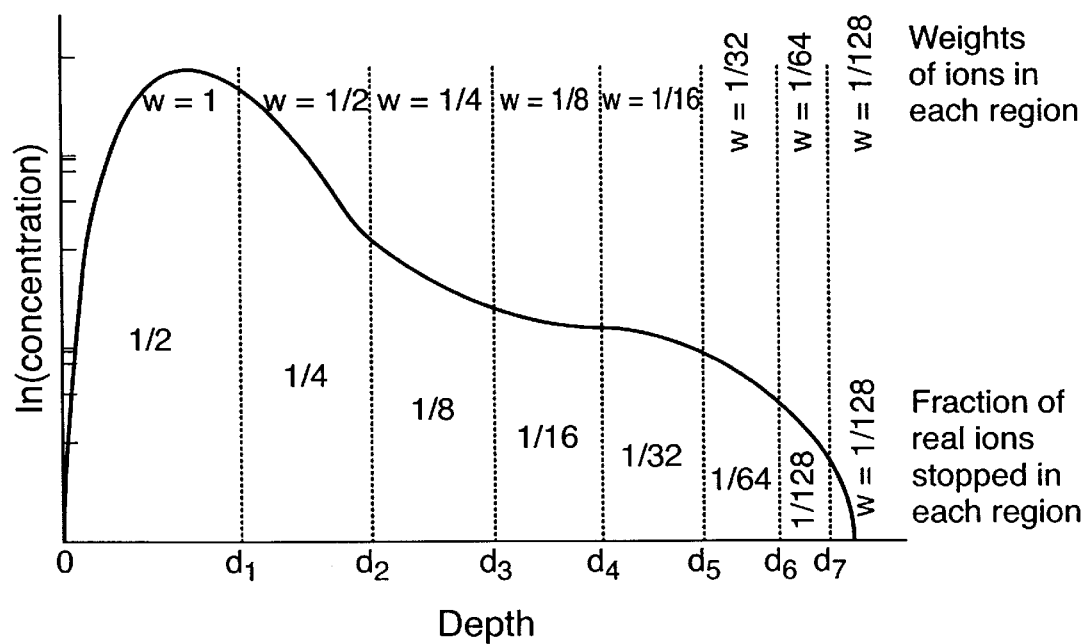
Fig. 2

DOPANT PROFILE MODELING BY RARE EVENT ENHANCED DOMAIN-FOLLOWING MOLECULAR DYNAMICS

RELATED APPLICATIONS

This application claims the benefit of U.S. Provisional Application Ser. No. 60/116,525, filed Jan. 20, 1999.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to simulations of ion implanted dopant profiles, and, more particularly, to simulations of ion implanted dopant profiles in semiconductors using molecular dynamics models.

BACKGROUND OF THE INVENTION

Ions are implanted into semiconductor wafers to dope regions within the semiconductor substrate in order to modify electrical properties of the substrate and thereby create new electronic devices. As used herein, the term ion will be used to refer to an implanted species and the term atom will be used to refer to a particle of the target material; neither term will connote the charge state of either atom type.

As performance demands increase, smaller devices are required with concomitant reduction in the volumes available to provide distinct doped regions. The measurement and modeling of dopant profiles within these ultrashallow junction devices present challenges, as effects that were negligible at high implant energies become increasingly important as the implant energy is lowered. The experimental measurement of dopant profiles by secondary ion mass spectrometry (SIMS) becomes problematic for very low energy (less than 10 keV) implants. There is a limited depth resolution of measured profiles due to profile broadening and mixing as the SIMS ion beam produces "knock-ons" and leads to effects such as diffusion of dopants and mixing. The roughness and disorder of the sample surface can also convolute the profile, although this can be avoided to a large extent by careful sample preparation.

The use of computer simulation as a method for studying the effects of ion bombardment of solids is well established. Binary collision approximation (BCA), "event-driven" codes, have traditionally been used to calculate such properties as ranges of implanted species and the damage distributions resulting from the collision cascade. The BCA approach breaks down at low energies where multiple collisions (where the ion has simultaneous interactions with more than one target atom) or collisions between moving atoms become significant, where the crystal binding energy is of the same order as the energy of the ion, or when the time spent within a collision is too long for the calculation of asymptotic trajectories to be valid. Such problems are clearly evident when one attempts to use the BCA to simulate channeling in semiconductors. Here, the interactions between the ion and the target are neither binary nor collisional in nature; rather they occur as many simultaneous soft interactions that steer the ion down the channel.

An alternative to BCA is to use molecular-dynamics (MD) simulation. Molecular dynamics has long been applied to the investigation of ion bombardment of materials to calculate the ion trajectories. With the increase in computational power, the development of efficient algorithms, and the production of accurate empirical potentials, it is now feasible to conduct realistic MD simulations.

In the classical MD model, atoms are represented by point masses that interact via an empirical potential function that is typically a function of bond lengths and angles; in the case of Si, a three-body or many-body potential, rather than a pair potential, is required to model the stable diamond lattice and to account for the bulk crystal properties. The trajectories of the atoms are obtained by numerical integration of Newton's laws, where the forces are obtained from the analytical derivative of the potential function. Thus, MD provides a far more realistic description of the collision processes than BCA, but at the expense of greater computational requirements. The present invention provides a high efficiency MD process that is optimized to calculate the concentration profiles of ions implanted into crystalline substrates such as silicon (Si), gallium arsenide (GaAs), and the like.

Various objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the purposes of the present invention, as embodied and broadly described herein, a computer-implemented molecular dynamics-based process simulates a distribution of ions implanted in a semiconductor substrate.

(a) The properties of the semiconductor substrate are initialized and ion dose is simulated, including an initial set of splitting depths to produce an equal number of virtual ions stopped in each interval between splitting depths.

(b) A first ion is input with selected velocity onto an impact position of the substrate and a first domain is initialized for the first ion during a first timestep, where the first domain includes all atoms of the substrate that exert a force on the ion and neighbor atoms.

(c) A first position of the first ion is determined after the first timestep.

(d) A second domain of the first ion at the first position is formed.

(e) A determination is made if the first ion has passed through a splitting depth.

(1) If not, the velocity into the substrate of the first ion is determined and a second timestep is initiated.

(2) If so, the first ion is split into first and second virtual ions, a new velocity into the substrate of the first virtual ion is determined after the first timestep and a second timestep is initiated with the first virtual ion.

(f) The first virtual ion is then set as the first ion, if created; the second timestep is set as the first time step; and the second domain is set as the first domain.

(g) Steps (c)–(e) are repeated and the second virtual ions created at each splitting interval are recorded until the first ion comes to rest and a second virtual ion is recorded as the deepest split ion.

(h) Steps (c)–(g) are repeated where the deepest split ion becomes the first ion until all of the ions resulting from splitting of the first ion come to rest.

(i) Steps (b)–(h) are then repeated until all of the ions in the ion dose to be simulated have come to rest.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIGS. 1A and 1B illustrate the efficiencies of the domain-following scheme of the present invention.

FIG. 2 illustrates the process for derivation of depths from an approximate ion splitting profile for use in the scheme of the present invention.

DETAILED DESCRIPTION

Figure 3:
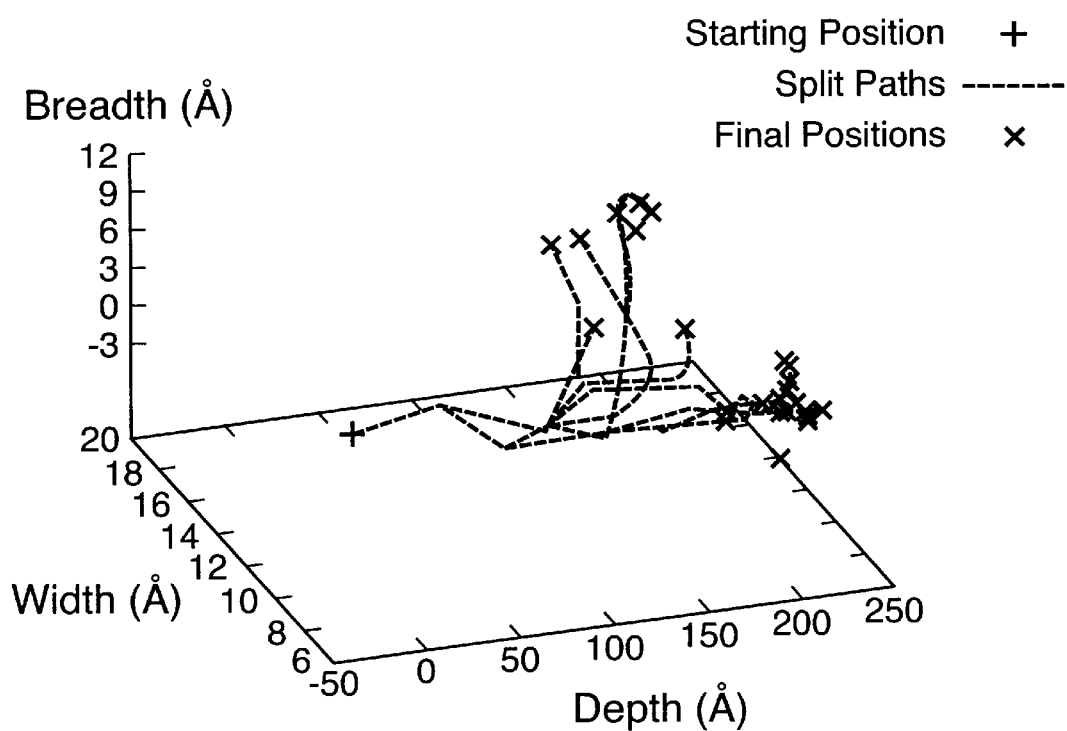
FIG. 3 illustrates the results of ion splitting for one implanted ion.

The basis of the molecular dynamics model is empirical potential functions that describe a collection of interactions between atoms and gives rise to forces between them. In addition to the classical interactions described by the potential functions, the interaction of the ion with electrons within the target is required for ion implant simulations, as this is the principle way in which the ion loses energy. This interaction is accomplished using an empirical inelastic collision model and a phenomenological electronic stopping-power model. The three energy-loss models (nuclear collision, inelastic collisions, and electronic stopping) are based on a consistent description of the electron distributions within the target. Other ingredients necessary to the computation are a description of the target material structure and thermal vibrations within the solid.

Interactions between the target atoms (e.g., Si, C, Ge, Ga, As, and the like) are modeled by many-body "Tersoff-type" potentials. See, e.g., J. Tersoff, Phys. Rev. B, Vol. 38, pp. 9902 (1988), incorporated herein by reference. Ion-target interactions are described by "ZBL" screened Coulomb potentials calculated using solid state Harte-Fock electron densities. See, e.g., J. F. Ziegler et al., The Stopping and Range of Ions in Solids (Pergamon Press, New York, 1985), incorporated herein by reference. The screened Coulomb potentials are also used to describe hard collisions between target atoms. Such potentials are well known in the literature and are used herein "as-is."

Throughout implant, an ion approaches close to target atoms during collisions. As electrons relax far more rapidly than the ion is moving, a "quasi-molecule" is formed during the collision. Hopping of electrons between the ion and atom transfers momentum between them, giving an inelastic collision that results in energy loss from the ion.

A previously developed model, L. M. Kishinevskii, Bull. Acad. Sci. USSR, Phys. Ser., Vol. 26, pp. 1433 (1962), incorporated herein by reference, has been modified to incorporate electron distributions used in the production of the screened Coulomb potentials. Thus, the model is realistic and is completely consistent with the empirical potential functions used; it gives the force between atoms i and j as:

$$F_{ij} = \frac{2^{1/3}\hbar}{2\pi a_B}(v_j - v_i)\left(Z_1^2 I\left(\frac{Z_1^{1/3}\alpha r_{ij}}{a}\right) + Z_2^2 I\left(\frac{Z_2^{1/3}(1-\alpha)r_{ij}}{a}\right)\right),$$

where:

$$I(X) = \int_X^\infty \frac{\chi^2(x)}{x}dx$$

and $$\alpha = \left(1 + \left(\frac{Z_2}{Z_1}\right)^{1/6}\right)^{-1}.$$

$\chi(x)$ is the ZBL universal screening function, Z is atomic number ($Z_1 > Z_2$), $r_{ij}$ is atomic separation, and $a=(9\pi^2/128)^{1/3}a_B$, where $a_B$ is the Bohr radius.

A new model that involves both global and local contributions to the electronic stopping is used for the electronic energy loss. See, D. Cai et al., Phys. Rev. B, Vol. 54, pp. 17147 (1996) and D. Cai et al., Int. J. Mod. Phys., Vol. 9, pp. 459 (1998), incorporated herein by reference. This model was developed for semi-conductors and contains only one fitted parameter per ion-target combination, for all energies and incident directions. By using a realistic stopping model with the minimum of fitted parameters, a good transferability is achieved to the modeling of implants outside the fitting set.

The local one electron radius $r_s$, ($r_s$ is related to the target electron density, $\rho$, by $1/\rho = 4/3\pi r_s^3$) is calculated by superposition of overlapping charge distributions of nearby atoms; again, the solid state Hartree Fock electron distributions are used. The one fitting parameter is $r_s^0$, the "average" one electron radius of the target material, which is adjusted to account for oscillations in the $Z_1$ dependence of the electronic stopping cross-section. The force on the ion is:

$$F = -Z_1^*(v, r_s^0)^2 S_p(r_s)v$$

where $Z_1^*(v, r_s^0)$ is the effective charge on an atom with atomic number $Z_1$ moving with speed $v$ through a material with an average one electron radius $r_s^0$, and $S_p(r_s)v$ is the stopping power of a proton with velocity $v$ where the local one electron radius is $r_s$.

The target is typically a zinc-blend, or diamond cubic, crystal (although there is no real restriction on the arrangement of target atoms) semiconductor, e.g., Si, SiC, SiGe, GaAs, and the like, with a surface amorphous or oxide layer. Thermal vibrations of atoms are modeled by displacing atoms from their lattice sites using a Debye model with experimentally obtained values of the Debye temperature.

A model for ion induced damage is included so that high dose implants can be simulated. The accumulation of damage within the target is described by a modified Kinchin-Pease model (G. H. Kinchin et al., 18 Rep. Prog. Phys., pp. 1 (1955), incorporated by reference):

$$\nu(E) = \begin{cases} 0 & E < E_d \\ \dfrac{0.2125\,E}{E_d} & E \geq E_d \end{cases}$$

where $E_d$ is the displacement threshold energy of the target, E is energy deposited as the ion travels past one target atom, and $\nu$ is the number of Frenkel pairs generated. A profile of deposited energy against depth is recorded for each ion run. When an ion stops, the energy profile is converted to a damage profile, which is then accumulated into the total damage profile. When building target material, the total damage profile is used to generate a statistical distribution of defects. Damage saturates at a density of four Frenkel pairs per unit cell, at which point a unit cell is assumed to be fully amorphized.

Neighbor lists (K. M. Beardmore, Ph.D. Thesis, Loughborough University of Technology, 1995) are used to make the potential and force calculation O(N), where N is the number of particles. Neighbor lists recognize that the interparticle interactions occur over only a short distance and identify the neighboring atoms within a specified distance of each atom in the target so that the calculations are performed over only those neighbors rather than over all of the atoms in the target.

The paths of the atoms are integrated using Verlet's algorithm (159 Phys. Rev., pp. 98 (1967), incorporated by reference), with a variable timestep that is dependent upon both kinetic and potential energy of atoms (Beardmore, supra.). The timestep is selected using:

$$\Delta t_n = \dfrac{C_{DIS}}{\sqrt{\max\limits_{1 \leq i \leq N}\left(\dfrac{2 \times [KE_i + \max(0, PE_i)]}{M_i}\right)}}$$

where $KE_i$, $PE_i$, and $M_i$, are the kinetic energy, potential energy, and mass, respectively, of atom i. Away from hard collisions, only the kinetic energy term is important, and the timestep is selected to give the fastest atom a movement of $C_{DIS}$ in a single timestep.

It is infeasible to calculate dopant profiles by full MD simulation. Although the method is O(N) in the number of atoms involved, the cost is approximately $O(u^4)$, where u is the initial ion velocity. In one aspect of the present invention, a restricted MD scheme uses domain following for each ion to produce accurate dopant profiles with a much smaller computational overhead, as illustrated in FIGS. 1A and 1B.

Since only the path of the implanted ion is of concern, only the region of material immediately surrounding the ion must be considered. A "domain" is the volume about the ion that contains all of the atoms that exert a force on the ion and neighbor atoms. "Neighbor" atoms are those additional atoms that exert a force on the atoms exerting a force on the ion. Target atoms are continually created and destroyed to follow the domain of the substrate that contains the ion. Material is built in slabs one unit cell thick to ensure that the ion is always surrounded by a given number of cells on each side. Material is destroyed if it is outside the domain defined by the ion position and the domain thickness. Hence, the ion experiences a complete crystal and the cost of the algorithm is reduced to O(u). This algorithm is similar to the "translation" approach used in the MIDRANGE computer code published by K. Nordlund, 3 Comput. Mat. Sci., pp. 448 (1995), incorporated herein by reference.

To further increase computational efficiency, only the motion of target atoms that are important to the simulation of the ion path are considered. This also has the effect of stabilizing atoms at the edge of the domain that otherwise would behave non-physically due to their lack of neighbors.

In this scheme, particles are divided into two sets: "on" and "off". Those that are "on" have their positions integrated and those that are "off" are stationary. At the start of the simulation, only the ion is turned on, and has forces calculated and position integrated. Some of the "off" atoms will be used in the force calculations and will have forces assigned to them. If the resultant force exceeds a certain threshold, the atoms is turned "on" and its motion is integrated (D. E. Harrison, Jr., in Critical Reviews in Solid State and Materials Sciences, ed. J. E. Greene (CRC, Boca Raton 1988), Vol. 14, Supp. 1).

In accordance with the present invention, two thresholds are used in the simulation: zero for atoms interacting directly with the ion and, for atom-atom interactions, a value given in the input file from published recommended values (K. M. Beardmore et al., Phys. Rev. E, Vol. 57, pp. 7278 (1998), incorporated herein by reference). The ion-atom interactions are the most critical for generating the correct motion for the ion, and such interactions require a lower threshold than the atom-atom interactions. In fact, for any reasonable threshold value, almost any ion-atom interaction will result in the atom being turned on, due to the large ion energy. Hence, the ion-atom threshold is set to zero as the preferred value herein, since adjusting the value provides no increase in efficiency.

In the case of the atom-atom threshold, a reasonable value is estimated by comparison to simulations without the moving atom approximation (MAA). Smith et al., Phys. Rev. B, Vol. 40, pg. 93 (1989), found that a force threshold of $1.12 \times 10^{-9}$ N for both atom-atom and ion-atom interactions gave a correct sputtering yield (when compared to simulations without the MAA) in the case of 1 KeV Ar implant into Si. For dopant implants, the present invention contemplates the use of a larger value ($8.0 \times 10^{-9}$ N), which provides a correct dopant profile when compared to simulations without the approximation.

The present process can use the larger value for two reasons. First, the motion of atoms not directly interacting with the ion only have a secondary effect on its motion by influencing the position of directly interacting atoms, so small errors in the positions of these atoms have little consequence. Second, by dividing the interactions into two sets, the threshold does not have to be lowered to give the correct ion-atom interactions.

For further efficiency, a minimum level of detail is used in describing the interactions between target atoms. While a many-body potential is used to describe a stable crystal lattice for low energy implants, this introduces a significant overhead to the simulations. A pair potential is sufficient to model the atom-atom interactions for higher ion velocities as only the repulsive interaction is significant. Hence, above a selected ion velocity, the complete many-body potential is switched to a pair potential approximation (PPA) for the atom-atom interactions. This is done herein by setting the many-body parameter within the Tersoff potential to its value for undistorted tetrahedral Si, and results in a Morse potential splined to a screened Coulomb potential.

At still higher ion energies, a further approximation uses only the ion-target atom interactions in determining the ion path. For ion velocities above a set threshold (recoil interaction approximation, RIA), only ion-target interactions are calculated (K. Nordlund, 3 Comp. Nat. Sci., pp. 448 (1995)). The RIA brings the MD scheme close to many BCA implementations. The major difference between the two approaches is that the ion path is obtained by integration, rather than by calculation of asymptotes, and that multiple interactions are, by the nature of the method, handled in the correct manner.

As thresholds are based on the ion velocity, a single high-energy ion simulation will switch between levels of approximation as the ion slows down and so produces the correct end-of-range behavior. For the present simulation, threshold values of 90.0 eV/$m_u$ and 270 eV/$m_u$ for the PPA and RIA, respectively, are sufficiently high that both low and high energy calculated profiles are unaffected by their use within the statistical noise of the simulation.

A typical dopant concentration profile in a zinc-blend crystal semiconductor, as illustrated in FIG. 2, has a characteristic shape consisting of a near-surface peak followed by an almost exponential decay over some distance into the material with a distinct end of range distance. The concentration of dopant in the tail of the profile is several orders of magnitude less than that at the peak. Hence, to calculate a statistically significant concentration at all depths of the profile, many ions will have to be run that are stopped near the peak for every one ion that stops in the tail, and most of the computational effort will not enhance the accuracy of the profile that is generated.

In order to remove this redundancy from the calculations, the present invention employs an "atom splitting" scheme to increase the sampling in the deep component of the concentration profile. The ion implant simulation is a new application of well-known general "Russian roulette and splitting" variance reduction schemes; see, e.g., J. M. Hammersley et al., Monte Carlo Methods, pp. 8 (Methuen, London 1964), incorporated herein by reference, which only generally discussed this approach with application to Monte Carlo calculations. At certain splitting depths in the material, each ion is replaced by two ions, each with a weighting of half that prior to splitting. Each split ion trajectory is run separately, and the weighting of the ion is recorded along with its final depth. As the split ions see different environments (material is built in front of the ion with random thermal displacements), the trajectories rapidly diverge from one another as shown in FIG. 3.

Due to this scheme, the same number of virtual ions is maintained at any depth, but their weights decrease with depth. As used herein, the term "virtual ion" means an ion that is weighted due to splitting. To maximize the advantages of this approach, the splitting depths are dynamically updated. The initial distance between splitting depths is obtained from an estimated profile for the dopant concentration. As the simulation is running, the calculated profile and the splitting depths are re-evaluated at intervals. The algorithm to determine the splitting depths from a given profile is illustrated in FIG. 2.

At the start of a simulation, the input data includes the number of orders of magnitude, M, of change in the concentration of moving ions over which the profile is to be calculated. Ions are split at depths where the total number of ions (ignoring weighting) becomes half of the number of actual implanted ions. Here, N is the number of splitting depths, where N is the largest integer $\leq M \log_2 10$. The splitting depths $d_i (1 \leq i \leq N)$ are then chosen such that $$\int_0^{d_1} C(x)\,dx = \left[1 - \left(\frac{1}{2}\right)^i\right] \int_0^\infty C(x)\,dx,$$

where C(x) is the concentration of stopped ions (i.e., the dopant concentration at depth x. Although an approximate profile from a few ions is used to generate the splitting depths, the integration is a smoothing operation and so gives good estimates of the splitting depths.

To minimize the storage requirements due to ion splitting, each real ion is run until it comes to rest, and the state of the domain is recorded at each splitting depth that is passed. The deepest split ion is then run, and further split ions are stored if it passes any splitting depths. This is repreated until all split ions have been run, then the next real ion is started. Hence, the maximum storage needed is one domain per splitting depth (i.e., 16 domains when splitting over 5 orders of magnitude). The running code consumes less than 1 Mb of memory.

Figure 4:
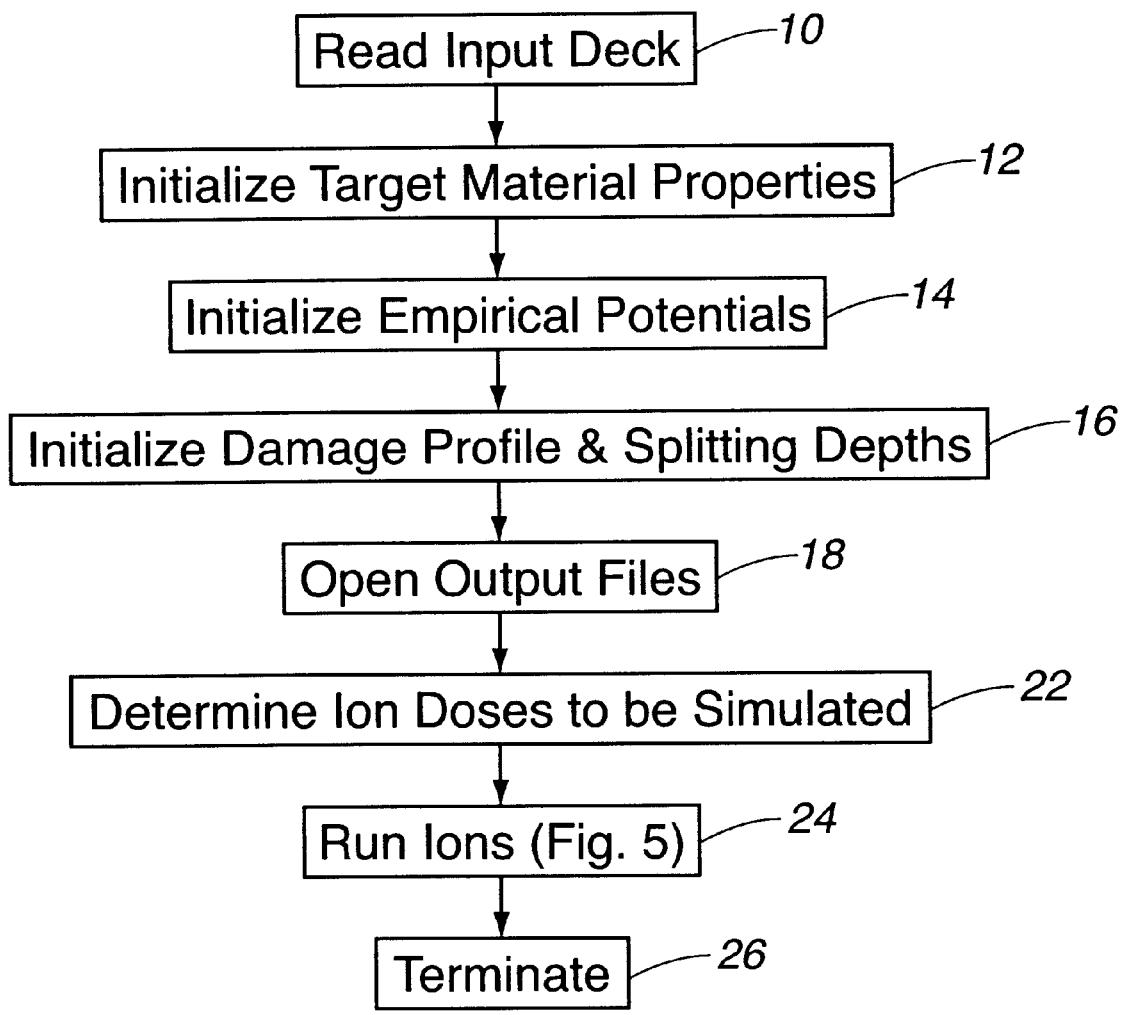
FIG. 4 is a process overview of the simulation process according to the present invention.
Figure 5:
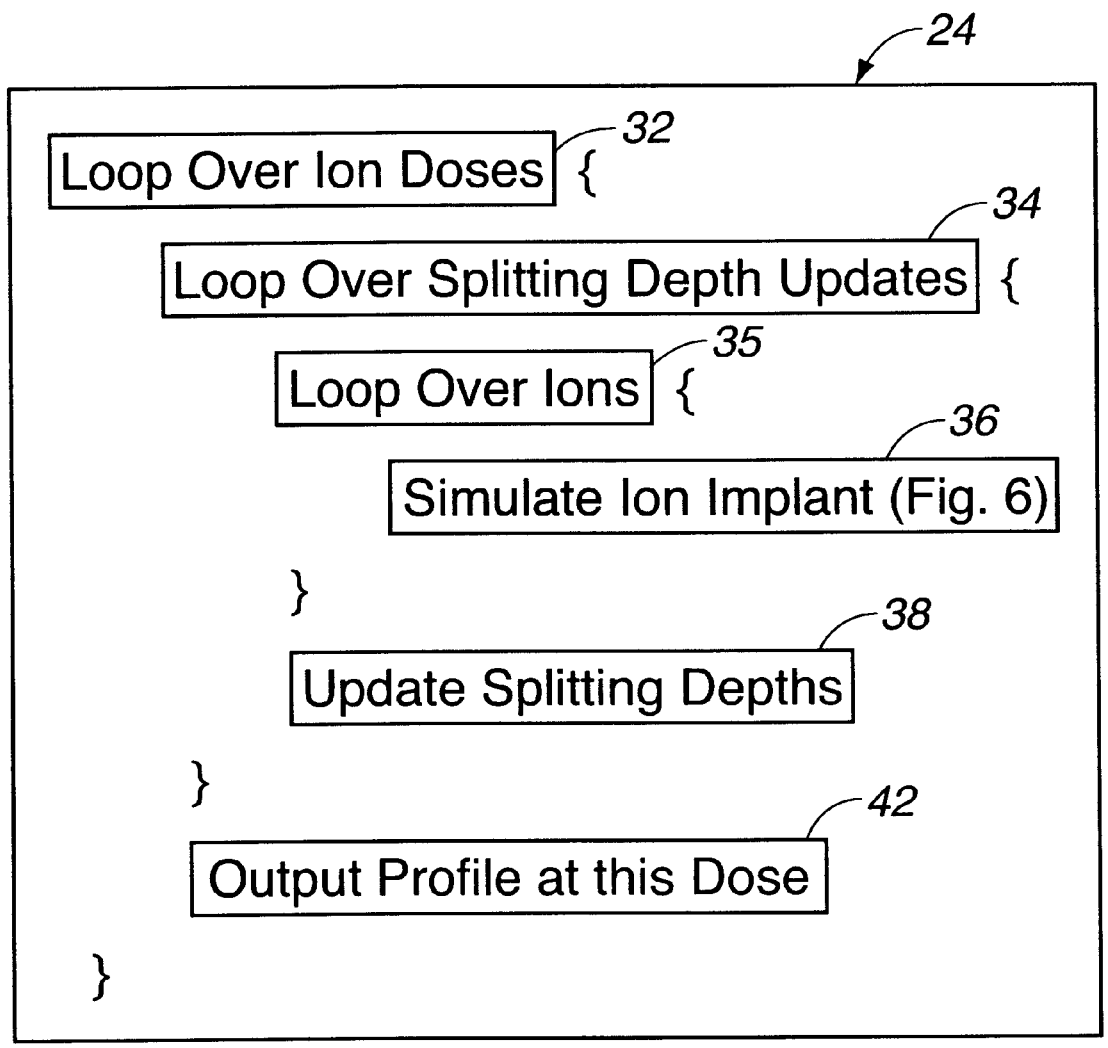
FIG. 5 more particularly depicts the overall ion implant process for use in the process of FIG. 4.
Figure 6:
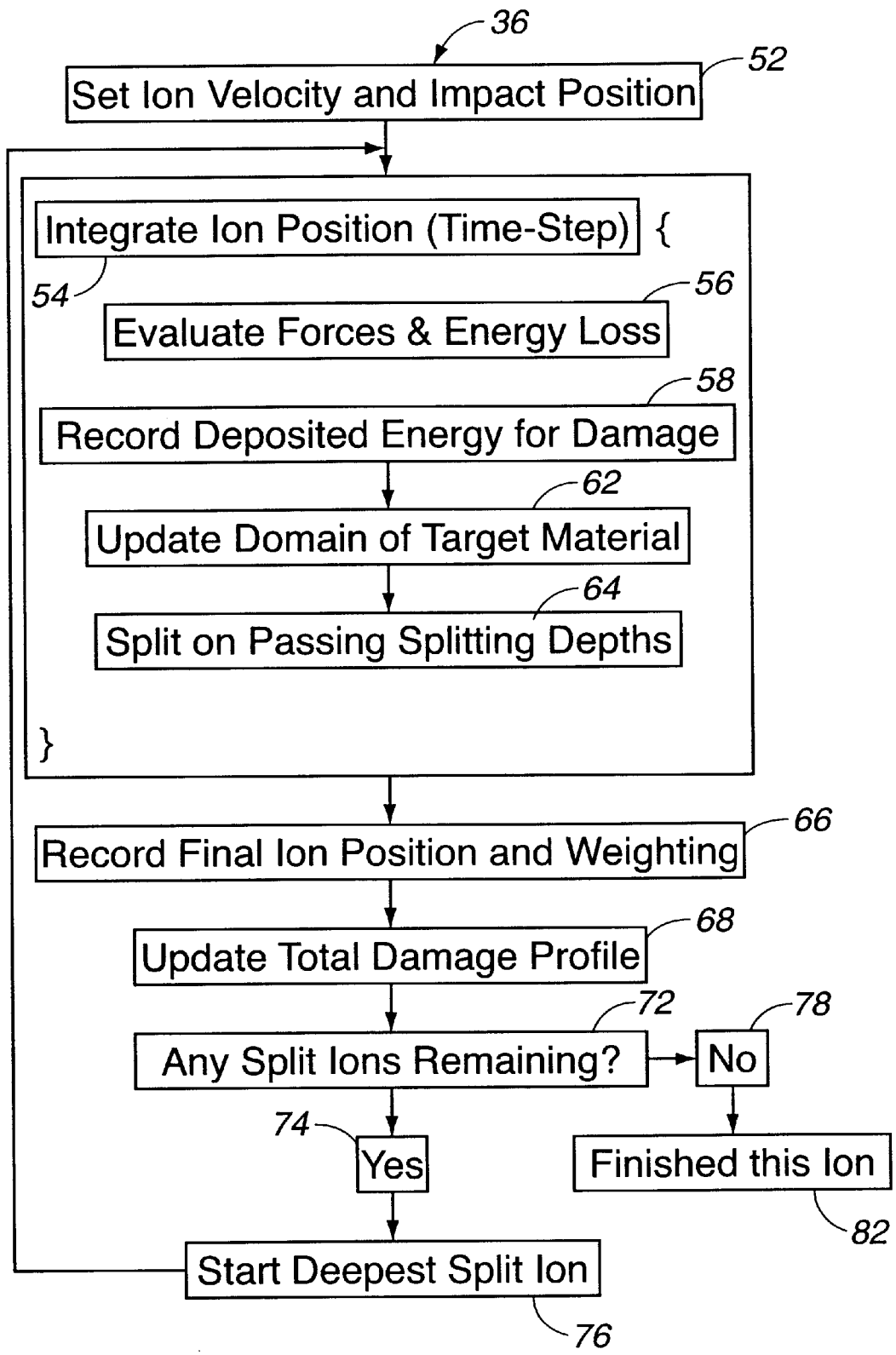
FIG. 6 more particularly depicts the process used to track each ion implant in the process of FIG. 5.

REED-MD (Rare Event Enhanced Domain following Molecular Dynamics) is a highly efficient classical molecular dynamics-based program for calculating the concentration depth profile of dopants in ion irradiated materials, as depicted in the process flow charts of FIGS. 4, 5, and 6. The method incorporates several methods for reducing computation overhead, plus a rare event algorithm that allows statistically reliable results to be obtained over a range of several orders of magnitude in dopant concentration.

Some of the physical models (empirical potential functions and Debye model) are taken directly from the literature. Others are modified for increased accuracy (inelastic energy loss and damage model), while still others (electronic stopping) have been developed by the inventors herein. The physical models are derived so that they employ a consistent description of the electron distribution within the target material.

Similarly, some of the computation algorithms (neighbor lists and variable timesteps) have been used before in molecular dynamics simulations and are used unaltered. However, most of the algorithms (moving atom approximation and recoil interaction approximation) are used in modified form with two thresholds, explained above. Finally, other process steps (domain following, pair potential approximation, and rare event enhancement) are the first application of these approximations and statistical techniques to molecular dynamics simulations.

Referring first to FIG. 4, an overview of REED-MD is presented. First, the input file is read 10 to input the parameters for the REED implant code. The input parameters comprise the following (recommended/default values are given in parentheses):

Number of elements in the system.

Atom properties—atomic number, atomic mass, fit parameter for the electronic stopping model ($r_s^0$ in atomic units), covalent radius of the atoms (Å).

Proportion of the target that is element number one (e.g., to build $Si_{0.8}Ge_{0.2}$, make the first element Si, the second element Ge, and set the proportion to 0.8)

Temperature of the target (K)—(300).

Tilt of the ion beam (theta), measured from normal incidence, in degrees.

Azimuthal angle (phi) made by the ion beam (to (011) plane for 100_face_in degrees.

Directions are defined in the standard manner for the <100> Si surface:

| (Theta, Phi) | Beam Direction |
|---|---|
| (0, 0) | <100> |
| (45, 45) | <110> |
| (7–15, 0–30) | Non-channeling |

Beam divergence in degrees.

The thickness of the surface amorphous (disordered) and oxide layer. Ion energy in keV.

Skin thickness used in the neighbor lists (as a percentage of the longest interaction distance)—(25%).

Distance moved by the fastest atom during a single timestep (Å)—(0.10).

Maximum allowed timestep size (in femtoseconds)—(2.0). Used in the selection of timestep size.

Number of unit cells on each side of the cell containing the ion in the domain following approximation. A value of 1 yields 3×3×3 unit cells.

Force threshold (in eV/Å) for turning on atoms under the Moving Atom Approximation—(5.0 eV/Å).

Velocity threshold (in eV/AMU) for switching all interactions—(90.00 for switch from many-body to pair interactions for target atoms; 270.00 for switch off all target-target interactions).

Frequency of writes of all domain information to an output file. Information is written for every ion; control size of file by setting to zero or a negative value.

Frequency of writes of information for visualization. Each write produces a new file. May be set to zero or a negative value to turn off reporting.

Frequency of writes of information on the ion. Useful for plotting ion paths, etc., but can produce very large files. May be set to zero or a negative value.

Percentage of silicon unit cells that initially contain damage—(00.00 for crystalline material; 100 for amorphous material). Unit cells are selected randomly and replaced by amorphous material.

Total number of ions that will be started—(1000).

Number of ions after which the profile and splitting-depths are re-calculated—(100).

Number of orders of magnitude in concentration that ions are split over—(5).

Name of a file containing a dopant profile. This is read in to initialize splitting depths at the start of the simulation. If the file does not exist, then an initial file is estimated. The file has the following format:

| xscale | |
|---|---|
| x1 | C(x1) |
| x2 | C(x2) |
| . | . |
| . | . |
| xn | C(xn) | where $C(x_i)$ is the dopant concentration at depth $x_i$ and xscale is a parameter to scale the depth to Å ($10^{-10}$ m), e.g. if the depth is measured in $\mu$m ($10^{-6}$ m), set xscale to 10000.0. The concentration is automatically scaled to the correct dose.

Threshold dose for damage to have an effect on the profile.

Damage yield (number of ½ Frenkel pairs generated per eV of deposited energy).

Number of doses at which output is wanted.

Doses at which output is wanted.

Next, the material properties are initialized 12. For each layer type (e.g., oxide and underlying crystal layers), the lattice constants and atomic displacements (Debye temperature) are selected. The emperical potentials are initialized 14 for the atom-atom and atom-ion species from lookup tables. The damage profile is initialized and appropriate splitting depths are estimated 16. A splitting profile (see "dopant profile" file above) is estimated using an assumed exponential decay with estimated penetration depths, if no profile is available to read in, and initial splitting depths as determined, as shown in FIG. 2. Appropriate output files are opened 18: tracking the progress of the process, calculated total ion implant profiles, damage profiles, 3D distribution of ion positions, and the like.

The ion doses that are to be simulated are determined 22. The total ion dose is broken in a series of implant doses, where each block of simulated ions corresponds to a changing number of ions in an actual ion dose. The system inserts doses so that Dose (i+1)/Dose (i) conforms to a maximum ratio between doses (typically about 3.5), where Dose (1) is the damage threshold dose (typically $1\times10^{13}$ ions cm$^{-2}$). The weighting for each simulated dose is determined, where the statistical weighting decreases over the series of simulated doses. Finally, each ion is input 24 to the substrate and the ion track is determined by the processes shown in FIGS. 5 and 6. The process is terminated 26 when all of the ions have been input.

FIG. 5 is an overview of the ion implantation 24 simulation. The simulation begins with the lowest dose 32 using the initial splitting profile and a simulated implant is run using the process depicted in FIG. 6. A first ion is input 36 and tracked to a resting location. This process loops 35 over the ions in the first ion dose. The splitting depths for the ions is reviewed periodically and updated 38 so that the splitting profile is dynamically updated as the simulation proceeds. Basically, the splitting depths are arranged to provide about the same number of weighted ions within each depth bin. An output profile is output 42 for each dose. The process then loops 32 back for another input ion dose.

The ion implant simulation process is shown in FIG. 6. An ion velocity (speed and direction) is generated and a random point on a unit cell on the surface is selected 52 for the input. The unit cell is the smallest crystal structure unit that can be repeated to form the entire structure. The ion is then input and the position of the ion is integrated 54 over each timestep using classical molecular dynamic calculations. The forces on the atomic structure and the ion energy loss are evaluated 56 over each timestep. The deposited energy in the target material is integrated and stored 58 to maintain a record of crystal damage and location. The domain of target material about the ion is updated 62, i.e., the immediate domain is rebuilt from the stored material and damage profiles, and the ion is split 64 if the ion has passed a splitting depth. The process returns to a new timestep 54 and steps 56, 58, 62, and 64 are repeated for the deepest split ion until the ion comes to rest.

When the final position of an ion is reached, the final ion position and the weighting of the ion are recorded 66. The total damage profile of the substrate structure is updated 68 from the stored record of energy deposition. The process determines 72 if there are any remaining split ions from the original input ion. If so 74, the deepest remaining split ion is selected 76 and the process repeats until all of the split atoms have reached a final position. When there are no more split atoms 78, the implantation simulation for that ion is completed and another ion is input 36.

Figure 7A:
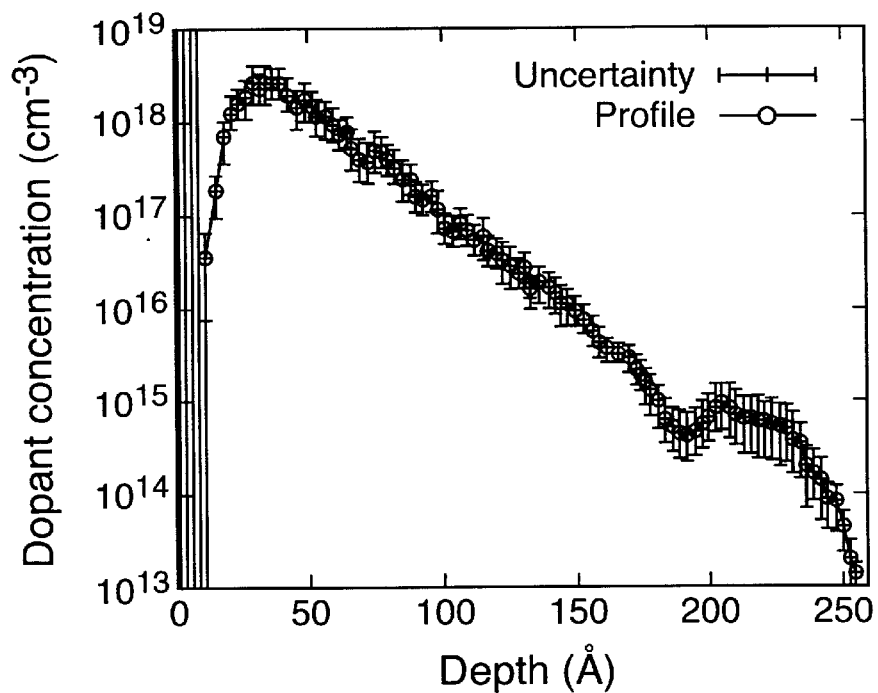
FIGS. 7A and 7B graphically depict the uncertainties in the calculated dopant profile due to 2 keV As $1 \times 10^{12}$ cm$^{-2}$ (7,0) implant into Si with 1 unit cell of surface oxide, for the same number of initial ions (1000) with and without rare event enhancement, respectively.
Figure 7B:
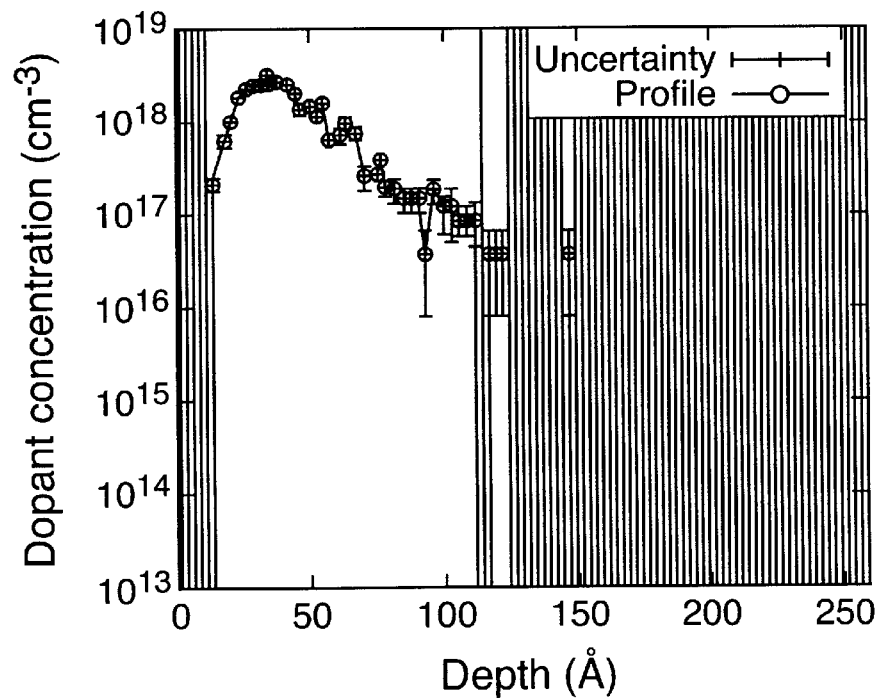

The uncertainty in the calculated dopant profiles was estimated by dividing the final ion depths into 10 sets. A depth profile was calculated from each set using a histogram of 100 bins, and the standard deviation of the distribution of the 10 concentrations for each bin was taken as the uncertainty. FIGS. 7A and 7B demonstrate the effectiveness of the process by comparing profiles obtained with and without atom splitting, respectively, over five orders of magnitude. It is estimated that the rare event algorithm reduces CPU time by a factor of 90 when calculating profiles over 3 orders of magnitude, and by a factor of 900 when calculating a profile over 5 orders of magnitude.

Figure 8A:
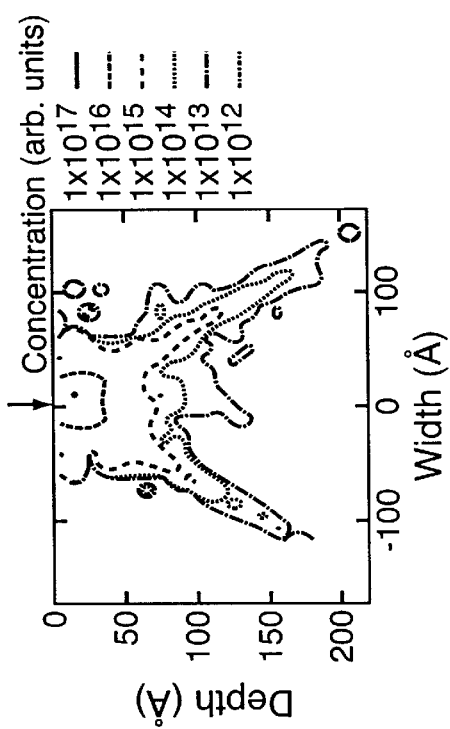
FIGS. 8A–8C are calculated 2D dopant profiles due to 0.2 keV B (0,0) implant into Si, 2 keV As (0,0) implant into Si with 1 unit cell of surface oxide, and 2 keV As (0,0) implant into Si with 3 unit cells of surface oxide, respectively.
Figure 8C:
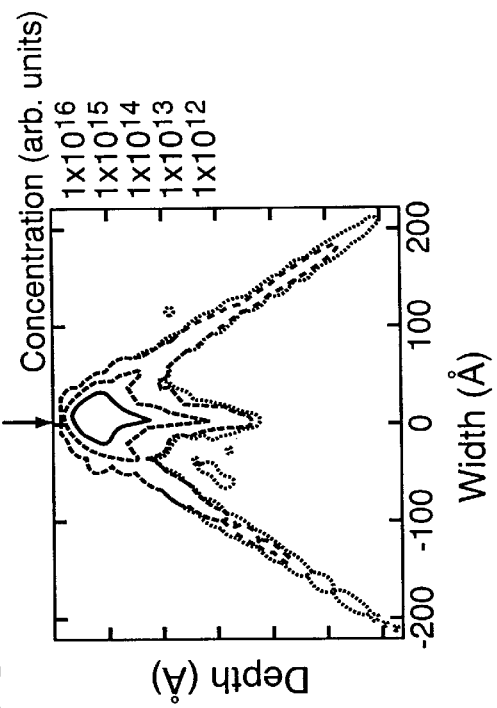
Figure 8B:
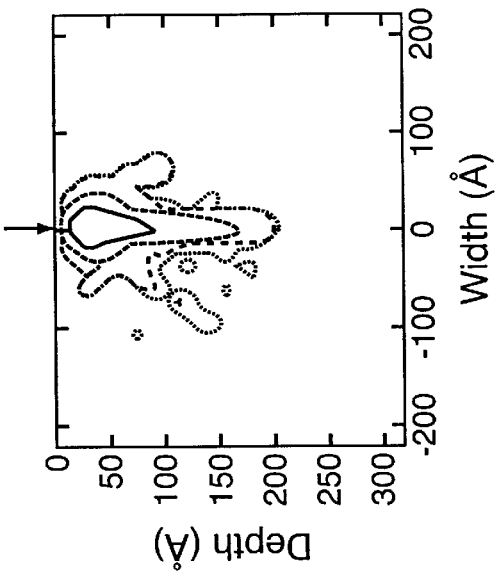

To further demonstrate the efficacy of the present invention, FIGS. 8A–C depict 2D profiles for low dose, low energy profiles to show scattering and surface effects. FIGS. 9A–D are exemplary 1D profiles that compare simulations with SIMS data. All simulations were run with a target temperature of 300 K, and a beam divergence of 1.0° was assumed. Each profile was constructed from 1000 ions, with the splitting depths updated every 25 ions, and a domain of 3×3×3 unit cells was used. The direction of the incident ion beam is specified by the angle of tilt, $\theta°$, from normal and the azimuthal angle $\phi°$, as $(\theta, \phi)$.

In the case of the low energy (<10 keV) implants, the substrate was assumed to comprise one unit cell thickness of surface oxide; for other cases, three unit cells of oxide were assumed at the surface. For the low energy implants, profiles were calculated over a change of five orders of magnitude in concentration; for the higher energy implants, profiles were calculated over 3 orders of magnitude. A dose of $1\times10^{12}$ cm$^{-2}$ (zero damage) was used unless otherwise noted.

Two-dimensional profiles are shown projected onto the plane normal to the surface and containing the zero degree azimuth. This makes it easy to differentiate between major channeling directions; the <100> channel is vertical, and the four <110> channels appear at angles of 35° from vertical. FIG. 8A shows the result of an ultra-low energy implant into Si. Although the implant is in the <100> direction, this channel is closed at such low ion energies and the only channeling occurs in the <110> direction. This demonstrates the need to have a "universal" electronic stopping model, rather than a model tuned to a particular channeling direction.

The effect of the amount of surface disorder is shown in FIGS. 8B and 8C. Increasing the thickness of the surface layer leads to more ions being scattered into the larger <110> channel, and hence gives a far deeper tail to the profile.

Figure 9A:
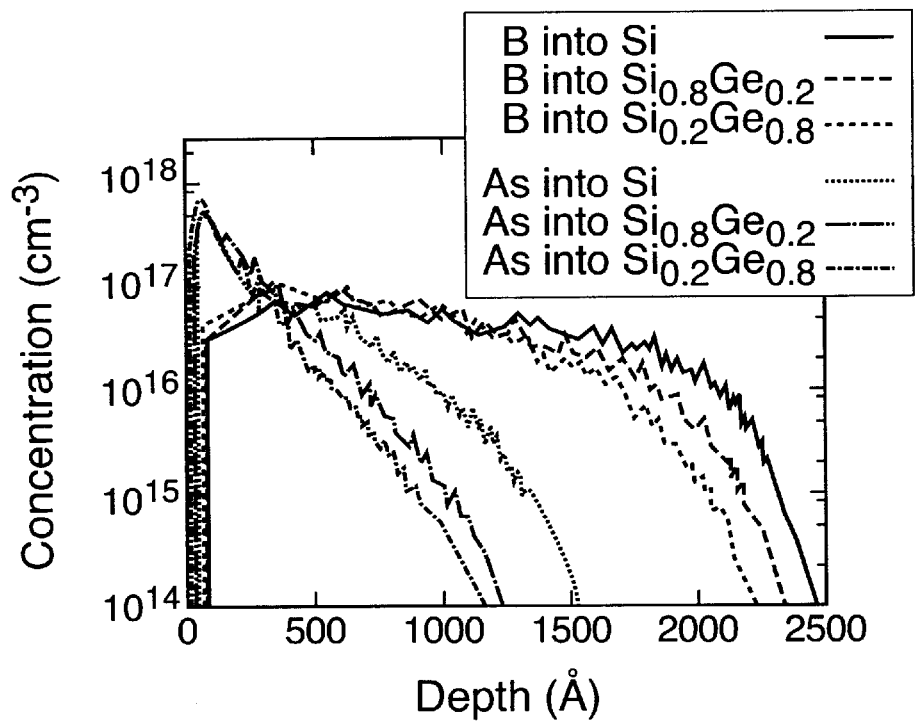
FIGS. 9A–9D illustrate the transferability of the simulation scheme of the present invention to a variety of implant situations: 10 keV B and As (0,0) implants into $Si_{1-x}Ge_x$; Zn $3 \times 10^{13}$ cm$^{-2}$ into GaAs; 150 keV Si $3 \times 10^{13}$ cm$^{-2}$ implants into GaAs; 300 keV Se $3 \times 10^{13}$ cm$^{-2}$ implants into GaAs, respectively.

There is increasing interest in the use of SiGe as a replacement for Si currently used in CMOS technology due to its higher switching speed. FIG. 9A shows the effect of Ge concentration on profiles from B and As ion implants into $Si_{1-x}Ge_x$ targets. The trend is clearly for shallower profiles with increasing Ge concentration, but this is extremely nonlinear; the difference between x=0 and x=0.2 profiles is greater than the difference between x=0.2 and x=0.8 profiles.

Figure 9B:
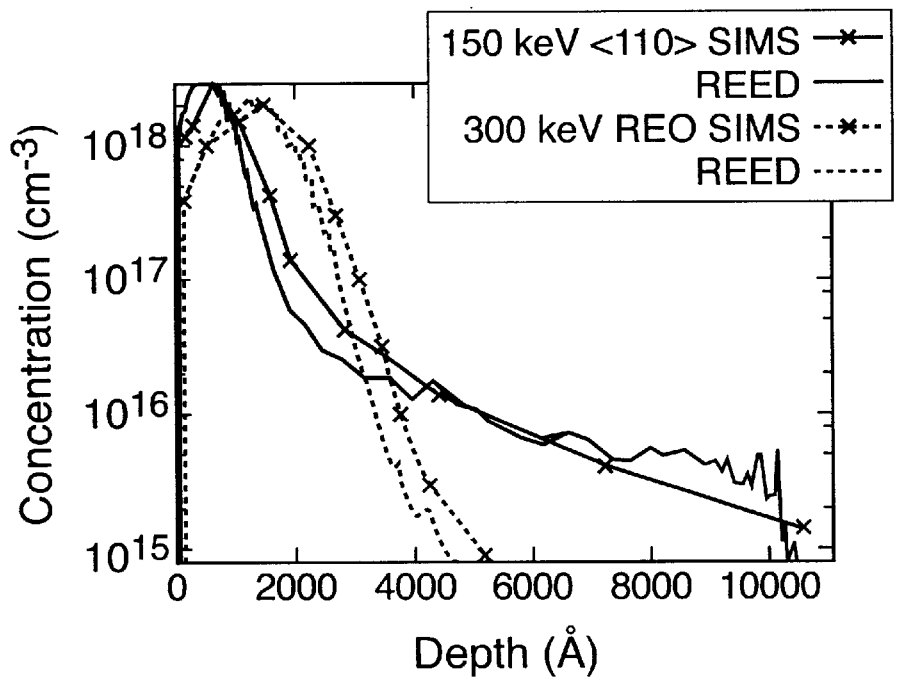
Figure 9C:
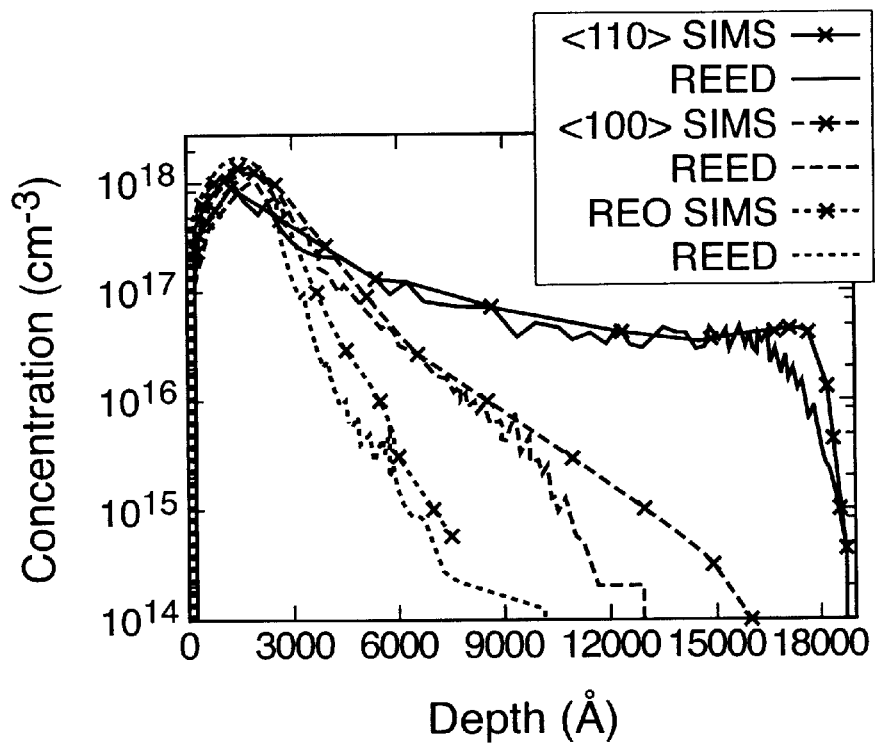
Figure 9D:
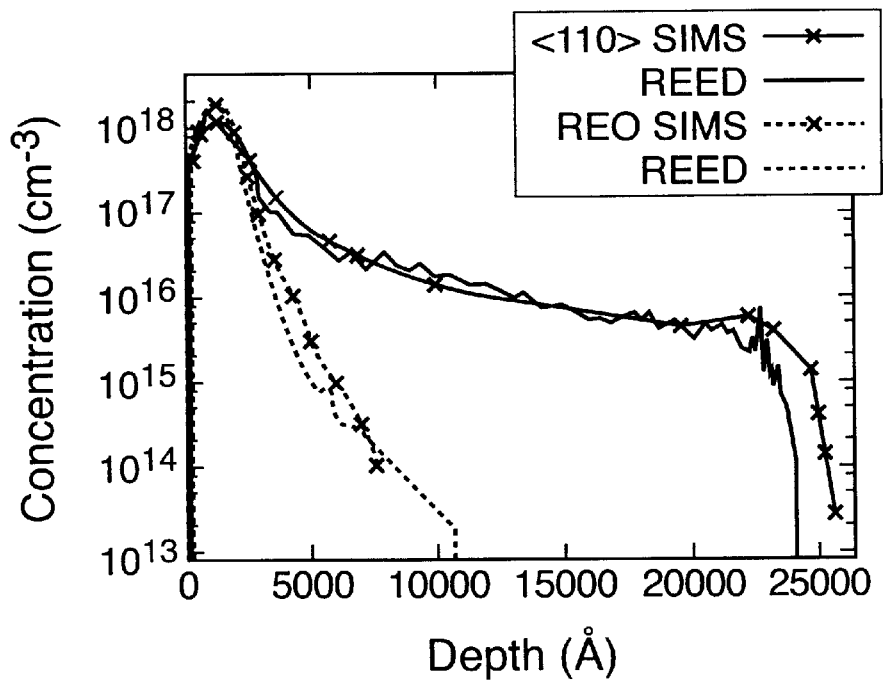

FIGS. 9B, 9C, and 9D show the calculated concentration profiles of several ion species implanted under various conditions into GaAs substrates and comparison with available SIMS data. FIG. 9B depicts implant profiles in GaAs from an ion dose of Zn at $3\times10$ cm$^{-2}$. FIG. 9C depicts implant profiles in GaAs from an ion dose of 150 keV Si at $3\times10^{13}$ cm$^{-2}$. FIG. 9D depicts implant profiles in GaAs from an ion dose of 300 keV Se at $3\times10^{13}$ cm$^{-2}$. The results of the REED calculations show good agreement with the experimental SIMS data, demonstrating the accuracy of the model proposed by the present invention and its transferability to many ion-target combinations and implant conditions.

The above simulations demonstrate that the simulation process described herein provides the accuracy associated with time-integrated atom paths with an efficiency far in excess of full MD simulation. While the simulation scheme is still more computationally expensive than the BCA approach, it is sufficiently fast to be used on modern desktop computer workstations. The method has two major advantages over the BCA approach: (i) The present MD model consists only of standard empirical potentials developed for bulk semiconductors and for ion-solid interactions. The only fitting is done in the electronic stopping model, and this involves only one parameter per ion-target combination. By using physically based models for all aspects of the scheme, good transferability is obtained to the modeling of implants outside the initial fitting set. (ii) The method does not break down at the low ion energies necessary for production of the next generation of semiconductor technology; it gives the correct description of multiple soft interactions that occur both in low-energy implants and higher energy channeling.

The invention described herein is further described in Beardmore et al., "Efficient molecular dynamics scheme for the calculation of dopant profiles due to ion implantation," Phys. Rev. E, Vol. 57, No. 6, pp. 7278–7287 (June 1998), incorporated herein by reference.

The foregoing description of the invention has been presented for purposes of illustration and description and is not intended to be exhaustive or to limit the invention to the precise form disclosed, and obviously many modifications and variations are possible in light of the above teaching.

The embodiment(s) were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A computer-implemented molecular dynamics-based process for simulating a distribution of ions implanted in a semiconductor substrate comprising the steps of:

(a) initializing the properties of the semiconductor substrate and ion dose to be simulated, including an initial set of splitting depths that contain an equal number of virtual ions implanted in each substrate volume determined by the splitting depths;

(b) inputting a first ion with selected velocity onto an impact position of the substrate and initializing a first domain for the first ion during a first timestep, where the first domain includes all atoms of the substrate that exert a force on the ion and neighbor atoms;

(c) determining a first position of the first ion after the first timestep;

(d) forming a second domain of the first ion at the first position;

(e) determining if the first ion has passed through a splitting depth;

(1) if not, determining the velocity into the substrate of the first ion and initiating a second timestep;

(2) if so, splitting the first ion into first and second virtual ions and determining a new velocity into the substrate of the first virtual ion after the first timestep and initiating a second timestep with the first virtual ion;

(f) setting the first virtual ion, if created, as the first ion, the second timestep as the first timestep, and the second domain as the first domain;

(g) repeating steps (c)–(e) and recording second virtual ions created at each splitting interval until the first ion comes to rest and a second virtual ion is recorded as the deepest split ion;

(h) repeating steps (c)–(g) where the deepest split ion becomes the first ion until all of the ions resulting from splitting of the first ion come to rest; and (i) repeating steps (b)–(h) until all of the ions in the ion dose to be simulated have come to rest.

2. A process according to claim 1 further including the steps of:

assigning each ion input at step (b) a weight of one; and dividing the weight by two each time a split occurs so that an ion at rest is characterized by its location in the semiconductor substrate and its weight.

3. A process according to claim 1 further including the steps of dynamically updating the implant distribution profile after a selected number of ions input at step (b) to reassign splitting depth intervals to maintain an equal number of ions in each substrate volume represented by each splitting interval.

4. A process according to claim 1, further including maintaining a damage profile from deposition of energy in the semiconductor substrate by ion passage through the substrate.

5. A process according to claim 1, wherein step (h) is always initiated for the deepest split ion in the substrate.

6. A process according to claim 1, where the timestep is a variable timestep selected to give a fastest atom in the domain a movement of a predetermined distance during the timestep.

7. A process according to claim 1, wherein the first ion is designated "on" and atoms comprising the domain are designated as "off" and considered stationary or "on" if ion-atom and atom-atom forces exceed a threshold value, where only the positions of "on" first ion and atoms are integrated during each timestep.

8. A process according to claim 1, where atom-atom forces are modeled as pair potential forces for ion velocities above a selected value and as a many-bodied potential at ion velocities below the selected value.

* * * * *